(12) United States Patent
Yuan et al.

(10) Patent No.: US 11,152,401 B2
(45) Date of Patent: Oct. 19, 2021

(54) FLEXIBLE DISPLAY SUBSTRATE AND PREPARATION METHOD THEREOF

(71) Applicant: Kunshan New Flat Panel Display Technology Center Co., Ltd., Kunshan (CN)

(72) Inventors: Bo Yuan, Kunshan (CN); Yucheng Liu, Kunshan (CN); Sheng Gao, Kunshan (CN); Lin Xu, Kunshan (CN)

(73) Assignee: Kunshan New Flat Panel Display Technology Center Co., Ltd., Jiangsu (CN)

( * ) Notice: Subject to any disclaimer, the term of this patent is extended or adjusted under 35 U.S.C. 154(b) by 0 days.

(21) Appl. No.: 16/317,417

(22) Filed: Jan. 11, 2019

(65) Prior Publication Data
US 2019/0244983 A1   Aug. 8, 2019

Related U.S. Application Data

(63) Continuation of application No. PCT/CN2017/097007, filed on Aug. 11, 2017.

(30) Foreign Application Priority Data

Aug. 24, 2016   (CN) .......................... 201610715972.8

(51) Int. Cl.
*H01L 27/12*   (2006.01)
*H01L 21/77*   (2017.01)
*H01L 23/498*  (2006.01)

(52) U.S. Cl.
CPC .......... *H01L 27/1244* (2013.01); *H01L 21/77* (2013.01); *H01L 23/4985* (2013.01);
(Continued)

(58) Field of Classification Search
CPC ............. H01L 27/1244; H01L 51/0097; H01L 27/3276; H01L 23/4985; H01L 27/1218; H01L 27/1262
See application file for complete search history.

(56) References Cited

U.S. PATENT DOCUMENTS

2004/0124763 A1   7/2004 Arokia et al.
2014/0138637 A1   5/2014 Yang et al.
(Continued)

FOREIGN PATENT DOCUMENTS

CN   101232013 A   7/2008
CN   102231028 A   11/2011
(Continued)

OTHER PUBLICATIONS

Moiseev et al., Multi-Net Optimization of VLSI Interconnect, Springer 2015 (Year: 2015).*
(Continued)

*Primary Examiner* — Shih Tsun A Chou

(57) ABSTRACT

The flexible display substrate provided by the present disclosure includes a flexible substrate, on which at least one conductive composite layer is disposed, each of the at least one conductive composite layer includes two metal layers and an insulated layer between the two metal layers, each of the two metal layers includes metal line segments separated from each other, the insulated layer is provided with contact holes, and the metal line segments in the two metal layers are connected through metal in the contact holes to form a continuous metal wire.

11 Claims, 3 Drawing Sheets

(52) U.S. Cl.
CPC .......... *H01L 27/12* (2013.01); *H01L 27/1218* (2013.01); *H01L 27/1262* (2013.01)

(56) References Cited

U.S. PATENT DOCUMENTS

| | | | |
|---|---|---|---|
| 2014/0217397 A1* | 8/2014 | Kwak | H01L 27/1218 257/43 |
| 2015/0263308 A1 | 9/2015 | Park et al. | |
| 2016/0179229 A1 | 6/2016 | Ahn | |
| 2016/0211210 A1 | 7/2016 | Seo et al. | |
| 2017/0020007 A1* | 1/2017 | Park | H05K 1/028 |

FOREIGN PATENT DOCUMENTS

| | | |
|---|---|---|
| CN | 102945846 A * | 2/2013 |
| CN | 102945846 A | 2/2013 |
| CN | 104538426 A | 4/2015 |
| CN | 104769719 A | 7/2015 |
| CN | 105144418 A | 12/2015 |
| CN | 205355054 U | 6/2016 |
| CN | 105786237 A | 7/2016 |
| CN | 105826350 A | 8/2016 |
| CN | 106206613 A | 12/2016 |
| JP | 1993-150263 A | 6/1993 |
| JP | 2004-531753 A | 10/2004 |
| JP | 2006-339186 A | 12/2006 |
| JP | 2011-23521 A | 2/2011 |
| JP | 2014-232300 A | 12/2014 |
| JP | 2015-62059 A | 4/2015 |
| JP | 2015-143846 A | 8/2015 |
| JP | 2016-503515 A | 2/2016 |
| JP | 2016-31499 A | 3/2016 |
| KR | 100708735 B1 | 4/2007 |
| KR | 1020120098970 A | 9/2012 |
| KR | 10-2014-0044567 A | 4/2014 |
| KR | 10-2014-0099139 A | 8/2014 |
| KR | 10-2015-0108469 A | 9/2015 |
| TW | 201535223 A | 9/2015 |

OTHER PUBLICATIONS

European Search Report in European Application No. 17842814.0 dated Nov. 11, 2 019. 8 pages.
CN Second Office Action dated March 5, 2019 in CN Application No. 201610715972.8, Includes English Translation. 16 pages.
Written Opinion of the International Searching Authority dated Nov. 16, 2017 in International Application No. PCT/CN2017/097007, Includes English Translation. 8 pages.
CN First Office Action dated Nov. 5, 2018 in CN Application No. 201610715972.8, Includes English Translation. 15 pages.
PCT International Search Report dated Nov. 16, 2017 in International Application No. PCT/CN2017/097007, Includes English Translation. 7 pages.
PCT Written Opinion dated Nov. 16, 2017 in International Application No. PCT/CN2017/097007, Includes English Translation. 11 pages.
Japanese Notice of Reasons for Refusal for Japanese application No. 2019-503725 dated Mar. 3, 2020.
Korean First Office Action for Application No. 10-2019-7002234 dated May 4, 2020.
Korean Notice of Reasons for Refusal for application No. 10-2019-7002234 dated Nov. 27, 2020.
Chinese Fourth Office Action for Application No. 201610715972.8 dated Sep. 14, 2020.
Japanese Notice of Reasons for Refusal for Japanese application No. 2019-503725 dated Sep. 23, 2020.

* cited by examiner

FLEXIBLE DISPLAY SUBSTRATE AND PREPARATION METHOD THEREOF

CROSS-REFERENCE TO RELATED APPLICATIONS

The present application is a continuation of international application No. PCT/CN2017/097007 filed on Aug. 11, 2017, which claims the benefit and priority of Chinese patent application No. 201610715972.8, entitled "flexible display substrate and preparation method thereof" and filed on Aug. 24, 2016. Both applications are incorporated herein in their entirety by reference.

TECHNICAL FIELD

The present disclosure relates to the field of display technologies, and more particularly, to a flexible display substrate and preparation method thereof.

BACKGROUND

As a new generation of display products, flexible displays are attracting more and more attention because of their advantages of ultra-light, ultra-thin, high definition, fast response, flexible, and easy to carry.

Flexible displays need to be rolled up or bent, or even bent frequently, during use, and thus, stress generated by deformation will be accumulated and superimposed on metal wires and insulated layers in a display substrate, which may cause the breakage of metal wires; meanwhile, after being bent many times, the insulated layers may break, in which results that the flexible displays fail to display properly, and thus service life of the flexible displays is seriously affected.

In order to solve above technical problems, a person skilled in the art mainly relies on methods such as setting holes in the metal wires or changing patterns (such as rectangles and waves) of the metal wires to release the stress. Although these methods can increase the number of times of use of the metal wires, and prolong the service life of the displays, requirements for lithographic apparatus are relatively high due to the punching of the metal wires or the changing of the pattern of the metal wires, which increases the process difficulty.

Prior art also discloses a method of using a material which is more flexible and easily bendable (such as graphene or nanosilver, and the like) to replace molybdenum, titanium or copper of a metal layer to form the metal wires of the display substrate. Although the method may prolong the number of times of use of the metal wire and improve the reliability of the displays, the cost is relatively high due to the limitation of the material, and the use of the substitute material may also cause a significant change in the structure and the preparation process of a flexible substrate, and thus, the method cannot be realized by existing equipment and process.

In addition, the above methods are only measures for improving the breakage of the metal wires, after adopting these measures, since the insulated layers are still continuous, the above methods cannot effectively release the stress accumulated in the insulated layers, and thus the technical problem that the insulated layers are easily broken cannot be solved.

SUMMARY

In view of this, embodiments of the present disclosure provide a flexible display substrate, which can effectively release the stress accumulated in the flexible display substrate, and reduce the probability of breakage of metal wires and insulated layers during the process of bending the flexible screen body. The present disclosure also provides a method for preparing a flexible display substrate, which may prevent the aging of a flexible display and prolong the life of the flexible display.

Embodiments of the present disclosure provide a flexible display substrate, including a flexible substrate, wherein at least one conductive composite layer is disposed on the flexible substrate, each of the at least one conductive composite layer comprises two metal layers and an insulated layer between the two metal layers, each of the two metal layers comprises metal line segments separated from each other, the insulated layer is provided with contact holes, and the metal line segments in the two metal layers are connected through metal in the contact holes to form a continuous metal wire.

In an embodiment of the present disclosure, wherein the metal line segments extend along substantially same direction.

In an embodiment of the present disclosure, wherein the metal line segments in the two metal layers in the each of the at least one conductive composite layer are malposed.

In an embodiment of the present disclosure, wherein the at least one conductive composite layer comprises a lower conductive composite layer and an upper conductive composite layer adjacent to the lower conductive composite layer, and the lower conductive composite layer and the upper conductive composite layer share a metal layer.

In an embodiment of the present disclosure, wherein metal line segments in different metal layers have different densities.

In an embodiment of the present disclosure, wherein the each of the at least one conductive composite layer comprises a first metal layer and a second metal layer, one end of the metal in the contact holes is connected to a head or a tail of metal line segments in the first metal layer, the other end of the metal in the contact holes is connected to a tail or a head of metal line segments in the second metal layer, and the density of the metal line segments in the first metal layer is greater than that of the metal line segments in the second metal layer.

In an embodiment of the present disclosure, wherein the each of the at least one conductive composite layer comprises a first metal layer, a second metal layer and a third metal layer, wherein metal line segments in the second metal layer comprise first metal line segments and third metal line segments separated from each other; one end of metal in contact holes between the first metal layer and the second metal layer is connected to a head or a tail of metal line segments in the first metal layer, the other end of the metal in the contact holes is connected to a tail or a head of the first metal line segments in the second metal layer, and the density of the metal line segments in the first metal layer is greater than that of the first metal line segments in the second metal layer; and/or one end of metal in contact holes between the third metal layer and the second metal layer is connected to a head or a tail of metal line segments in the third metal layer, and the other end of the metal in the contact holes is connected to a tail or a head of the third metal line segments in the second metal layer, and the density of the metal line segments in the third metal layer is greater than that of the third metal line segments in the second metal layer.

In an embodiment of the present disclosure, wherein the each of the at least one conductive composite layer comprises a first metal layer, a second metal layer and a third metal layer; one end of metal in contact holes between the first metal layer and the second metal layer is connected to a head or a tail of metal line segments in the first metal layer, and the other end of the metal in the contact holes is connected to a tail or a head of metal line segments in the second metal layer; and one end of metal in contact holes between the second metal layer and the third metal layer is connected to the head or the tail of the metal line segments in the second metal layer, and the other end of the metal in the contact holes is connected to a tail or a head of the metal line segments in the third metal layer, the density of the metal line segments in the first metal layer is greater than that of the metal line segments in the second metal layer, the density of the metal line segments in the third metal layer is greater than that of the metal line segments in the second metal layer, and the density of the metal line segments in the first metal layer is less than that of the metal line segments in the third metal layer.

In an embodiment of the present disclosure, wherein the continuous metal wire is used as a data line or a gate line.

In an embodiment of the present disclosure, wherein the metal wire is made of one of aluminum, titanium, molybdenum or aluminum alloy, titanium alloy, and molybdenum alloy.

In an embodiment of the present disclosure, wherein the insulated layer is made of silicon nitride or silicon oxide.

In an embodiment of the present disclosure, wherein the material of the flexible substrate is one of polyimide, polycarbonate, polyacrylate, polyetherimide, polyethersulfone or polyethylene terephthalate.

Embodiments of the present disclosure provides a method for preparing a flexible display substrate, including: preparing a flexible substrate; disposing a plurality of insulated layers and a plurality of metal layers on the flexible substrate alternately, and the disposing a plurality of insulated layers and a plurality of metal layers on the flexible substrate alternately further comprises following steps: disposing contact holes on an insulated layer between adjacent metal layers of the plurality of metal layers, wherein the contact holes are filled with metal; disposing metal line segments separated from each other and extending along substantially same direction on each of the plurality of metal layers; and connecting metal line segments in the adjacent metal layers alternately through the metal in the contact holes to form a continuous metal wire.

In an embodiment of the present disclosure, the method for preparing a flexible display substrate includes: preparing a flexible substrate; forming a first insulated layer on the flexible substrate; forming a first metal layer on the first insulated layer, and disposing metal line segments separated from each other and extending along substantially same direction in the first metal layer; forming a second insulated layer on the first metal layer, and disposing contact holes on the second insulated layer, wherein the contact holes are filled with metal; and forming a second metal layer on the second insulated layer, disposing metal line segments separated from each other and extending along substantially same direction in the second metal layer, connecting one end of the metal in the contact holes to a head or a tail of the metal line segments in the first metal layer, and connecting the other end of the metal in the contact holes to a tail or a head of the metal line segments in the second metal layer.

In the flexible display substrate provided by the embodiments of the present disclosure, the metal line segments in different metal layers are alternately connected to each other to form a continuous metal wire arranged in a plurality of metal layers and having a polygonal structure and a plurality of relatively independent insulated layer blocks, and thus the stress accumulated in the flexible display substrate may be effectively released, and the probability of breakage of the metal wire and the insulated layer during the process of bending the flexible screen body may be reduced. In the method for preparing a flexible display substrate provided by the embodiments of the present disclosure, the metal wire segments in a plurality of metal layers are alternately connected by using the contact holes to form a continuous metal wire arranged in a plurality of metal layers and having a polygonal structure and a plurality of relatively independent insulated layer blocks, thereby preventing the aging of a flexible display, and prolonging the service life of the flexible display.

DETAILED DESCRIPTION

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

Figure 1:
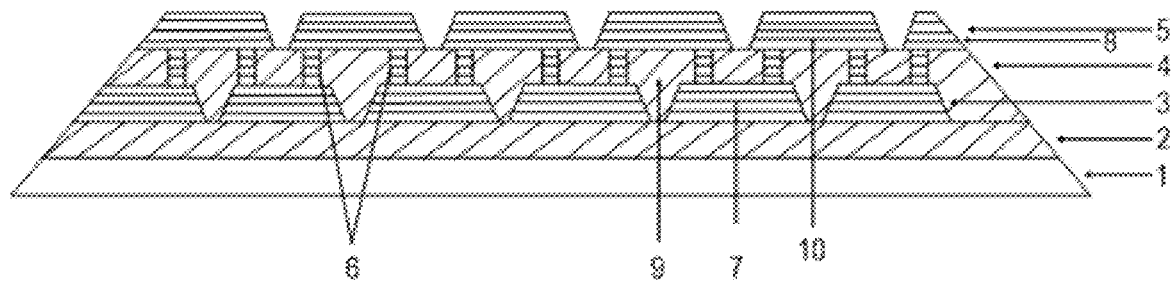
FIG. 1 is a structural schematic diagram of a flexible display substrate according to an embodiment of the present disclosure.
Figure 2:
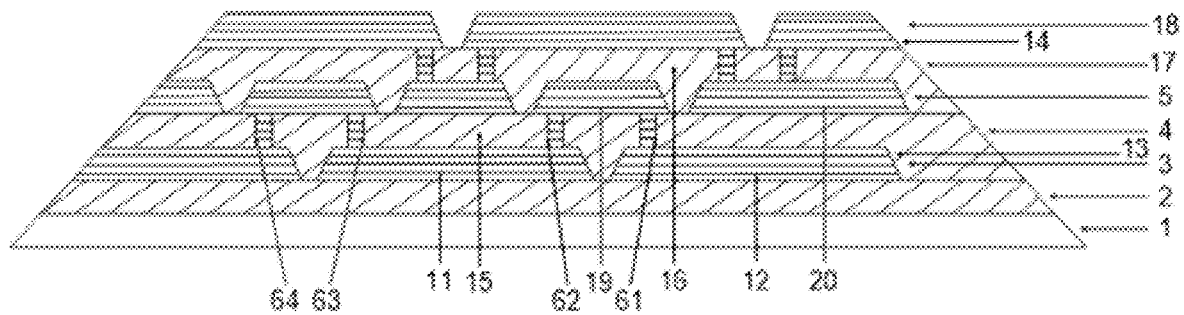
FIG. 2 is a structural schematic diagram of a flexible display substrate according to another embodiment of the present disclosure.
Figure 3:
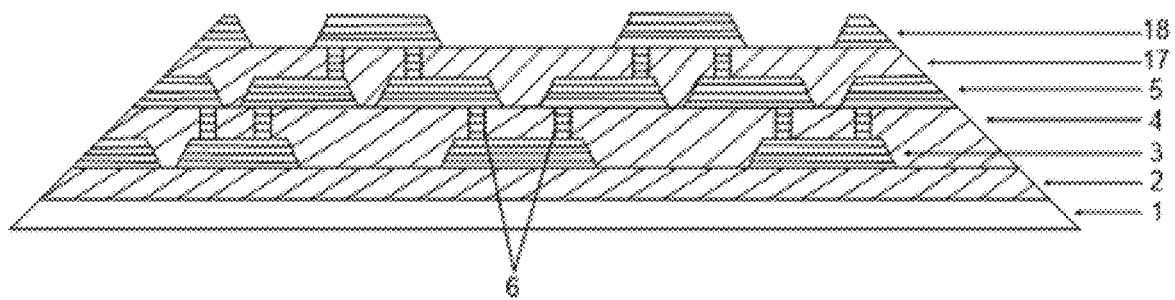
FIG. 3 is a structural schematic diagram of a flexible display substrate according to another embodiment of the present disclosure.

FIG. 1 is a structural schematic diagram of a flexible display substrate according to an embodiment of the present disclosure, FIG. 2 is a structural schematic diagram of a flexible display substrate according to another embodiment of the present disclosure, and FIG. 3 is a structural schematic diagram of a flexible display substrate according to another embodiment of the present disclosure.

The flexible display substrate provided by the present disclosure includes a flexible substrate 1, wherein insulated layers and metal layers are alternately provided on the flexible substrate 1. The metal layers include metal line segments having the same or similar extension direction and separated from each other, an insulated layer between adjacent metal layers is provided with contact holes 6, and the metal line segments in the adjacent metal layers are alternately connected through metal in the contact holes 6 to form a continuous metal wire.

In the embodiment shown in FIG. 1, the flexible display substrate includes a flexible substrate 1, and a first insulated layer 2, a first metal layer 3, a second insulated layer 4 and a second metal layer 5 are sequentially disposed on the flexible substrate 1. The first metal layer 3 and the second metal layer 5 respectively include metal line segments 7 and metal line segments 10 having the same or similar extension direction and separated from each other. One end of the metal in the contact holes 6 is connected to a head or a tail of metal line segments in the first metal layer 3, and the other end of the metal in the contact holes 6 is connected to a tail or a head of metal line segments of the second metal layer 5.

In addition, the density of the metal line segments 7 in the first metal layer 3 may be different from that of the metal line segments 10 in the second metal layer 5. For example, in the flexible display substrate of the present embodiment, the first metal layer 3 may be used as a gate and partial traces; the metal line segments 10 in the second metal layer 5 may be used as an upper plate of a capacitor, and thus the number of the metal line segments 7 in the first metal layer 3 is more than that of the metal line segments 10 in the second metal layer 5. In a specific embodiment, the ratio of the number of the metal line segments 7 in the first metal layer 3 and that of the metal line segments 10 in the second metal layer 5 is about 3:2.

In the flexible display substrate of the present embodiment, the metal line segments in the adjacent metal layers are malposed and are connected through the metal in the contact holes, thereby forming a continuous metal wire (for example, a metal wire 8) reciprocating through the insulated layer and having a polygonal structure. In addition, a complete insulated layer (such as the second insulated layer 4) is divided to a plurality of relatively independent insulated layer blocks 9 by the holes 6, the holes 6 are used to connect the metal layers 3 and 5, and thus the stress accumulated in the flexible display substrate may be further effectively reduced, and the probability of breakage of the metal wire and the insulated layer during the process of bending the flexible screen body may be reduced.

In the embodiment shown in FIG. 2, a first insulated layer 2, a first metal layer 3, a second insulated layer 4, a second metal layer 5, a third insulated layer 17 and a third metal layer 18 are sequentially disposed on a flexible display substrate 1. Each of the first metal layer 3, the second metal layer 5 and the third metal layer 18 includes metal line segments having the same or similar extension direction and separated from each other. For example, in the first metal layer 3, there is provided with first metal line segments 11 and third metal line segments 12 separated from each other. In the second metal layer 5, there is provided with first metal line segments 19 and third metal line segments 20 separated from each other. In the second insulated layer 4, there is a plurality of contact holes 61, 62, 63 and 64, wherein each of the plurality of contact holes is filled with metal. A lower end of the metal in the contact hole 61 in the second insulated layer 4 is connected to a head of the third metal line segment 12 in the first metal layer 3, and an upper end of the metal in the contact hole 61 in the second insulated layer 4 is connected to a tail of the first metal line segment 19 in the second metal layer 5. The metal in the remaining contact holes in the second insulated layer 4 is connected in a similar manner, and the remaining insulated layers and the adjacent metal layers thereof are also connected in a similar manner, which will not be described in detail.

The densities of the metal line segments in the first metal layer 3, the metal line segments in the second metal layer 5, and the metal line segments in the third metal layer 18 may be different. For example, in the flexible display substrate of the present embodiment, the first metal layer 3 may be used as a gate and partial traces, and thus the number of metal line segments in the first metal layer 3 may be a little more; the metal line segments in the second metal layer 5 may be used as an upper plate of a capacitor, and thus the number of the metal line segments in the second metal layer 5 may be fewer; the metal line segments in the third metal layer 18 may be used as traces, and thus the number of the metal line segments in the third metal layer 18 may also be a little more. In a specific embodiment, the densities of the metal line segments in the first metal layer 3, the second metal layer 5 and the third metal layer 18 are different, and the ratio of the densities is about 3:2:4.

In the flexible display substrate of the present embodiment, the metal line segments in the adjacent metal layers (for example, the first metal layer 3 and the second metal layer 5) are malposed and are connected through the metal in the contact holes, thereby forming a continuous metal wire (for example, a metal wire 13) reciprocating through the insulated layer and having a polygonal structure; the metal line segments in the adjacent metal layers (for example, the second metal layer 5 and the third metal layer 18) are malposed and are connected through the metal in the contact holes, thereby forming a continuous metal wire (for example, a metal wire 14) reciprocating through the insulated layer and having a polygonal structure. In addition, the second insulated layer 4 and the third insulated layer 17 are also respectively divided into a plurality of relatively independent insulated layer blocks 15 and 16, and thus the probability of breakage of the metal wire and the insulated layer during the process of bending the flexible screen body may be reduced.

In the embodiment shown in FIG. 3, a first insulated layer 2, a first metal layer 3, a second insulated layer 4, a second metal layer 5, a third insulated layer 17 and a third metal layer 18 are sequentially disposed on a flexible display substrate 1. Each of the first metal layer 3, the second metal layer 5 and the third metal layer 18 includes metal line segments having the same or similar extension direction and separated from each other. The difference from the above embodiments is the connection mode of the metal line segments. In the present embodiment, the metal line segments in the first metal layer 3 and the third metal layer 18 are also connected through the metal line segments in the second metal layer 5, that is, one end of the metal in the contact holes 6 in the second insulated layer 4 is connected to a head or a tail of the metal line segments in the first metal layer 3, and the other end of the metal in the contact holes 6 is connected to a tail or a head of the metal line segments in the second metal layer 5; one end of the metal in the contact holes 6 in the third insulated layer 17 is connected to the head or the tail of the metal line segments in the second metal layer 5, and the other end of the metal in the contact holes 6 is connected to a tail or a head of the metal line segments in the third metal layer 18, thereby as a whole forming a continuous metal wire and a plurality of relatively independent insulated blocks, wherein the continuous metal wire is alternately arranged in three metal layers including an upper metal layer, a middle metal layer and a lower metal layer and the continuous metal wire has a polygonal structure.

The densities of the metal line segments in the first metal layer 3, the metal line segments in the second metal layer 5, and the metal line segments in the third metal layer 18 may be different. For example, in the flexible display substrate of the present embodiment, the first metal layer 3 may be used as a gate and partial traces, and thus the number of metal line segments in the first metal layer 3 may be a little more; the metal line segments in the second metal layer 5 may be used as an upper plate of a capacitor, and thus the number of the metal line segments in the second metal layer 5 may be fewer; the metal line segments in the third metal layer 18 may be used as traces, and thus the number of the metal line segments in the third metal layer 18 may also be a little more. In a specific embodiment, the densities of the metal line segments in the first metal layer 3, the second metal layer 5 and the third metal layer 18 are different, and the ratio of the densities is about 3:2:4.

It will be readily understood for a person skilled in the art that the above embodiments are merely examples of the present disclosure, and an operator may design different numbers of insulated layers, metal layers and metal line segments, and may also select different connection modes of metal line segments according to actual requirements for resolution or other aspects, the present disclosure is not specifically limited thereto.

In an embodiment of the present disclosure, the continuous metal wire may be used as a data line or a gate line. Certainly, the metal wire may also be used as a signal line carrying other information. The material of the metal wire may be one of the metals such as aluminum, titanium, and molybdenum, or may be one of the alloys such as an aluminum alloy, a titanium alloy, or a molybdenum alloy, the present disclosure is not specifically limited thereto.

In an embodiment of the present disclosure, the insulated layer is one of silicon nitride or silicon oxide, and may be, for example, $Si_xN_y$ or $Si_xO_y$, the present disclosure is not specifically limited thereto.

In an embodiment of the present disclosure, the material of the flexible substrate 1 may be one of polyimide, polycarbonate, polyacrylate, polyetherimide, polyethersulfone or polyethylene terephthalate, the present disclosure is not specifically limited thereto.

Figure 4:
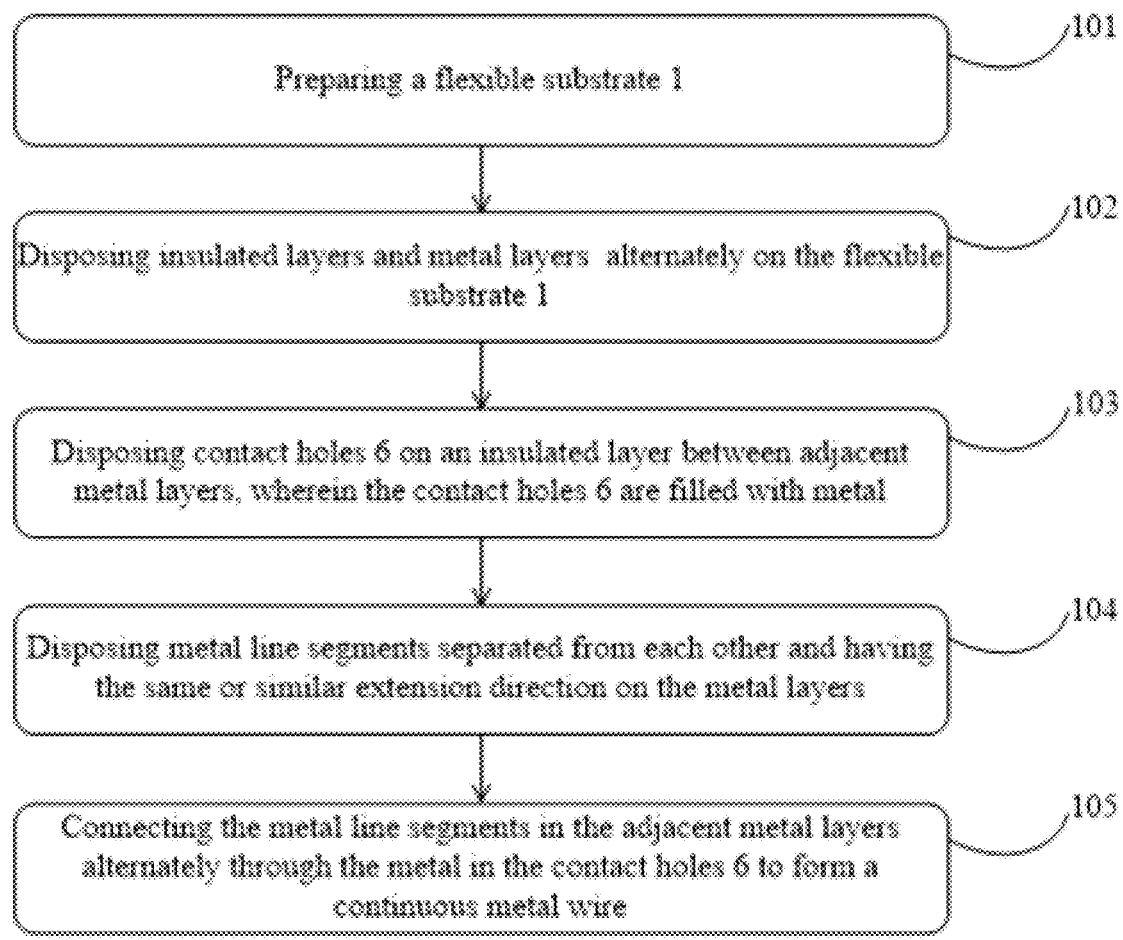
FIG. 4 is a schematic flowchart of a method for preparing a flexible display substrate according to an embodiment of the present disclosure.

Embodiments of the present disclosure further provide a method for preparing a flexible display substrate. FIG. 4 is a schematic flowchart of a method for preparing a flexible display substrate according to an embodiment of the present disclosure, as shown in FIG. 4, the method includes following steps.

Step 101, preparing a flexible substrate 1.

The material of the flexible substrate 1 may be one of polyimide, polycarbonate, polyacrylate, polyetherimide, polyethersulfone or polyethylene terephthalate, the present disclosure is not specifically limited thereto.

Step 102, disposing insulated layers and metal layers alternately on the flexible substrate 1. While disposing the insulated layers and the metal layers, following steps are also performed.

Step 103, disposing contact holes 6 on an insulated layer between adjacent metal layers, wherein the contact holes 6 are filled with metal.

Step 104, disposing metal line segments separated from each other and having the same or similar extension direction on the metal layers.

Step 105, connecting the metal line segments in the adjacent metal layers alternately through the metal in the contact holes 6 to form a continuous metal wire.

In the above method, the insulated layer and the metal layer adjacent to the insulated layer form a conductive composite layer.

Figure 5:
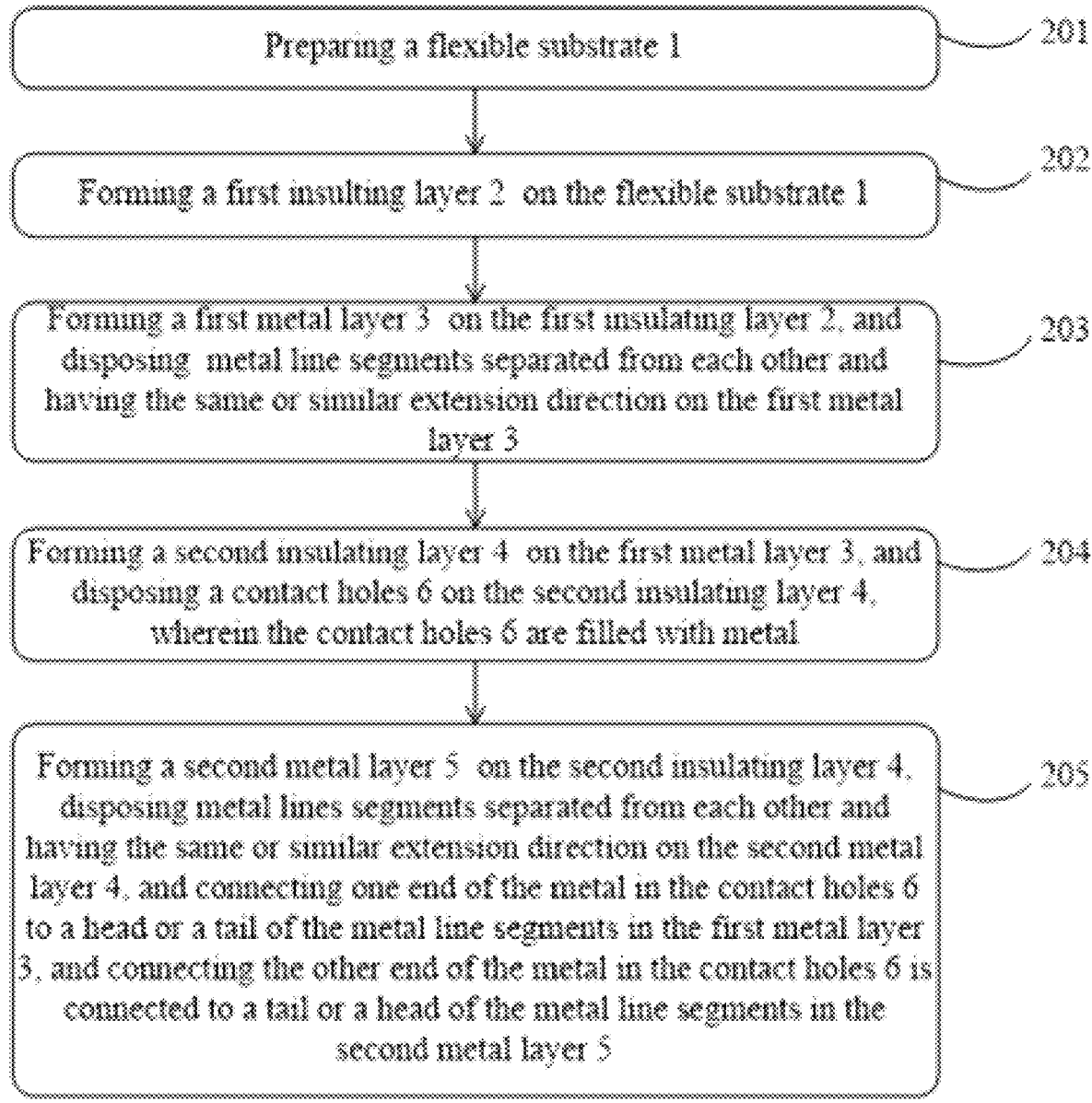
FIG. 5 is a schematic flowchart of a method for preparing a flexible display substrate according to another embodiment of the present disclosure.

FIG. 5 is a schematic flowchart of a method for preparing a flexible display substrate according to another embodiment of the present disclosure, as shown in FIG. 5, the method includes following steps.

Step 201, preparing a flexible substrate 1.

Step 202, forming a first insulting layer 2 on the flexible substrate 1.

Step 203, forming a first metal layer 3 on the first insulated layer 2, and disposing metal line segments separated from each other and having the same or similar extension direction on the first metal layer 3.

Step 204, forming a second insulated layer 4 on the first metal layer 3, and disposing contact holes 6 on the second insulated layer 4, wherein the contact holes 6 are filled with metal.

Step 205, forming a second metal layer 5 on the second insulated layer 4, disposing metal line segments separated from each other and having the same or similar extension direction on the second metal layer 4, connecting one end of the metal in the contact holes 6 to a head or a tail of the metal line segments in the first metal layer 3, and connecting the other end of the metal in the contact holes 6 to a tail or a head of the metal line segments in the second metal layer 5.

In the above method, the insulated layer and the metal layer (or metal line segment) adjacent to the insulated layer form a conductive composite layer.

In an embodiment of the present disclosure, the metal layer is formed by a photolithography etching process. In another embodiment, the metal layer may also be formed by a process such as printing, inkjet, physical vapor deposition, or the like, the present disclosure is not specifically limited thereto.

Obviously, a person skilled in the art can deduce the preparation method of using more metal layers and selecting different connection modes based on this preparation method and the embodiments of the above flexible display substrate, which will not be described in the present disclosure.

In the flexible display substrate provided by the embodiments of the present disclosure, the metal line segments in different metal layers are alternately connected to each other to form a continuous metal wire arranged in a plurality of metal layers and having a polygonal structure, and a plurality of relatively independent insulated layer blocks, and thus the stress accumulated in the flexible display substrate may be effectively released, and the probability of breakage of the metal wire and the insulated layer during the process of bending the flexible screen body may be reduced. In the method for preparing a flexible display substrate provided by the embodiments of the present disclosure, the metal wire segments in a plurality of metal layers are alternately connected by using the contact holes to form a continuous metal wire arranged in a plurality of metal layers and having a polygonal structure and a plurality of relatively independent insulated layer blocks, thereby preventing the aging of a flexible display, and prolonging the service life of the flexible display.

The foregoing description only describes preferred embodiments of the present disclosure and is not used for limiting the protection scope thereof. Any modification, equivalent substitution, or improvement made without departing from the spirit and principle of the present disclosure should be covered by the protection scope of the present disclosure.

The present disclosure relates to the field of display technologies, the flexible display substrate of the present disclosure may effectively reduce the stress accumulated in the flexible display substrate, and reduce the probability of breakage of the metal wire and the insulated layer during the process of bending the flexible screen body. The method for preparing a flexible display substrate of the present disclosure may prevent the aging of a flexible display and prolong service life of the flexible display.

What is claimed is:

1. A flexible display substrate, comprising:
   a flexible substrate;
   a first conductive composite layer disposed on the flexible substrate, wherein the first conductive composite layer comprises a first metal layer, a second insulated layer and a second metal layer stacked in sequence, the first metal layer and the second metal layer respectively comprise metal line segments separated from each other, the second insulated layer is provided with a plurality of first contact holes, and metal line segments in the first metal layer and metal line segments in the second metal layer are connected through metal in the plurality of first contact holes to form a first continuous metal wire; and
   a second conductive composite layer disposed on the flexible substrate, wherein the second conductive composite layer comprises a fourth metal layer, a third insulated layer and a fifth metal layer stacked in sequence, the fourth metal layer and the fifth metal layer respectively comprise metal line segments separated from each other, the third insulated layer is provided with a plurality of second contact holes, metal line segments in the fourth metal layer and metal line segments in the fifth metal layer are connected through metal in the plurality of second contact holes to form a second continuous metal wire,
   the metal line segments in the second metal layer and the metal line segments in the fourth metal layer are located at a same layer so that the second metal layer and the fourth metal layer share the same layer, and the metal line segments in the second metal layer are insulated from the metal line segments in the fourth metal layer.

2. The flexible display substrate of claim 1, wherein the metal line segments in the first metal layer, the metal line segments in the second metal layer, the metal line segments in the fourth metal layer and the metal line segments in the fifth metal layer respectively extend along substantially same extension direction.

3. The flexible display substrate of claim 1, wherein metal line segments in two metal layers in each of at least one of the first conductive composite layer and the second conductive composite layer are malposed.

4. The flexible display substrate of claim 1, wherein the metal line segments in the first metal layer, the metal line segments in the second metal layer and the metal line segments in the fifth metal layer have different densities.

5. The flexible display substrate of claim 1, wherein one end of the metal in the plurality of first contact holes is connected to a head or a tail of the metal line segments in the first metal layer, the other end of the metal in the plurality of first contact holes is connected to a tail or a head of the metal line segments in the second metal layer, and a density of the metal line segments in the first metal layer is greater than that of the metal line segments in the second metal layer.

6. The flexible display substrate of claim 1, wherein the first continuous metal wire is used as a data line or a gate line.

7. The flexible display substrate of claim 1, wherein the first continuous metal wire is made of one of aluminum, titanium, molybdenum or aluminum alloy, titanium alloy, and molybdenum alloy.

8. The flexible display substrate of claim 1, wherein the second insulated layer is made of silicon nitride or silicon oxide.

9. The flexible display substrate of claim 1, wherein the material of the flexible substrate is one of polyimide, polycarbonate, polyacrylate, polyetherimide, polyethersulfone or polyethylene terephthalate.

10. The flexible display substrate of claim 1, wherein the second metal layer is only connected to the first metal layer, and the fourth metal layer is only connected to the fifth metal layer.

11. The flexible display substrate of claim 1, wherein the metal line segments in the second metal layer and the metal line segments in the fourth metal layer are malposed.

* * * * *